United States Patent
Balakrishnan et al.

(10) Patent No.: US 9,520,469 B1
(45) Date of Patent: Dec. 13, 2016

(54) FABRICATION OF FIN STRUCTURES HAVING HIGH GERMANIUM CONTENT

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/854,665

(22) Filed: Sep. 15, 2015

(51) Int. Cl.
*H01L 29/66* (2006.01)
*H01L 29/78* (2006.01)
(Continued)

(52) U.S. Cl.
CPC ..... *H01L 29/1037* (2013.01); *H01L 21/02532* (2013.01); *H01L 21/02609* (2013.01); *H01L 21/02614* (2013.01); *H01L 21/308* (2013.01); *H01L 21/3065* (2013.01); *H01L 21/30604* (2013.01); *H01L 21/31111* (2013.01); *H01L 21/823431* (2013.01); *H01L 21/823821* (2013.01); *H01L 21/845* (2013.01); *H01L 27/0886* (2013.01); *H01L 27/1211* (2013.01); *H01L 29/045* (2013.01);
(Continued)

(58) Field of Classification Search
CPC ............. H01L 29/66795; H01L 29/785; H01L 29/1054; H01L 21/823821; H01L 21/823431;H01L 27/1211; H01L 29/7851; H01L 29/66818; H01L 21/845; H01L 21/02532; H01L 27/0886
See application file for complete search history.

(56) References Cited

U.S. PATENT DOCUMENTS 7,427,779 B2  9/2008 Damlencourt et al.
8,048,723 B2  11/2011 Chang et al.
(Continued)

OTHER PUBLICATIONS

Hashemi et al., "High-Mobility High-Ge-Content Si1-xGex-OI PMOS FinFETs with Fins Formed Using 3D Germanium Condensation with Ge Fraction up to x~0.7, Scaled EOT~8.5Å and ~10nm Fin Width", 2015 Symposium on VLSI Technology Digest of Technical Papers.

*Primary Examiner* — Marvin Payen
*Assistant Examiner* — Jeremy Joy
(74) *Attorney, Agent, or Firm* — Ryan, Mason & Lewis, LLP

(57) ABSTRACT

High Ge content SiGe fins are provided, as well as improved techniques for forming high Ge content SiGe fins. A high Ge content fin is formed by obtaining one or more low Ge content SiGe fins having a hard mask deposited thereon; forming a high Ge content SiGe fin around the one or more low Ge content SiGe fins by oxidizing one or more sidewalls of the one or more low Ge content SiGe fins to create one or more oxide shells on the one or more sidewalls; removing the one or more oxide shells; and selectively removing the one or more low Ge content SiGe fins to produce a high Ge content SiGe fin device. A Fin Field Effect Transistor (FinFET) is also provided, comprising an insulating layer; and at least one high Ge content fin formed on the insulating layer, wherein the at least one high Ge content fin has asymmetric recesses into the insulator layer.

18 Claims, 7 Drawing Sheets

(51) Int. Cl.
*H01L 21/306* (2006.01)
*H01L 21/20* (2006.01)
*H01L 29/10* (2006.01)
*H01L 21/84* (2006.01)
*H01L 21/02* (2006.01)
*H01L 21/3065* (2006.01)
*H01L 21/308* (2006.01)
*H01L 21/311* (2006.01)
*H01L 29/161* (2006.01)
*H01L 29/06* (2006.01)
*H01L 29/04* (2006.01)
*H01L 27/12* (2006.01)
*H01L 21/8238* (2006.01)
*H01L 27/088* (2006.01)
*H01L 21/8234* (2006.01)

(52) U.S. Cl.
CPC ...... *H01L 29/0649* (2013.01); *H01L 29/1054* (2013.01); *H01L 29/161* (2013.01); *H01L 29/66795* (2013.01); *H01L 29/66818* (2013.01); *H01L 29/785* (2013.01); *H01L 29/7851* (2013.01)

(56) References Cited

U.S. PATENT DOCUMENTS

| | | |
|---|---|---|
| 8,211,772 B2 | 7/2012 | Kavalieros et al. |
| 8,394,690 B2 | 3/2013 | Ikeda et al. |
| 8,975,125 B2 | 3/2015 | Adam et al. |
| 2011/0037129 A1* | 2/2011 | Yu .................... H01L 29/66795 257/401 |
| 2012/0025313 A1 | 2/2012 | Chang et al. |
| 2014/0030876 A1 | 1/2014 | Flachowsky et al. |
| 2014/0041812 A1 | 2/2014 | Strand |
| 2014/0084370 A1 | 3/2014 | Cappellani et al. |
| 2014/0170839 A1* | 6/2014 | Brunco ............ H01L 29/66795 438/479 |
| 2014/0312423 A1 | 10/2014 | Cheng et al. |
| 2014/0346612 A1* | 11/2014 | Adam ............... H01L 21/76205 257/397 |
| 2014/0357034 A1* | 12/2014 | Cheng .................. H01L 29/785 438/275 |
| 2015/0008489 A1* | 1/2015 | Ching ............... H01L 29/66795 257/288 |
| 2015/0028454 A1 | 1/2015 | Cheng et al. |
| 2015/0041958 A1 | 2/2015 | Cheng et al. |
| 2015/0076514 A1 | 3/2015 | Morin et al. |
| 2015/0108572 A1* | 4/2015 | Cheng ................ H01L 27/1211 257/347 |
| 2016/0071956 A1* | 3/2016 | Balakrishnan .... H01L 29/66818 257/401 |

* cited by examiner

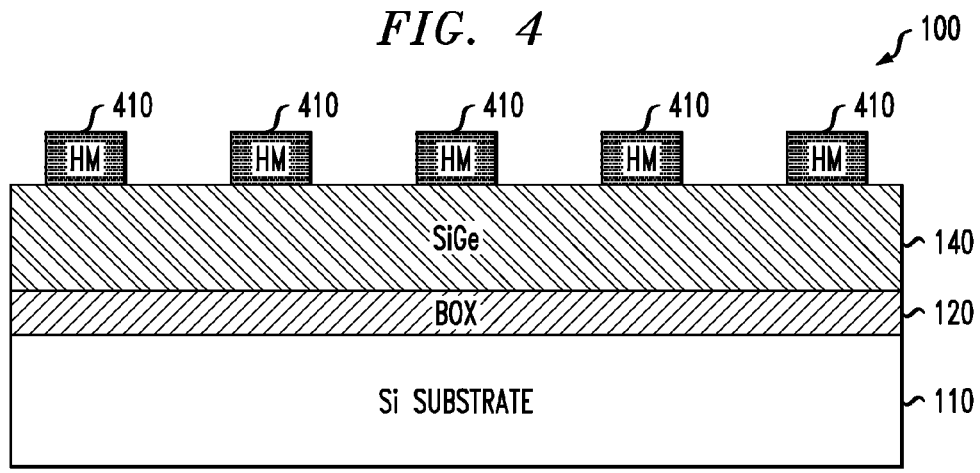
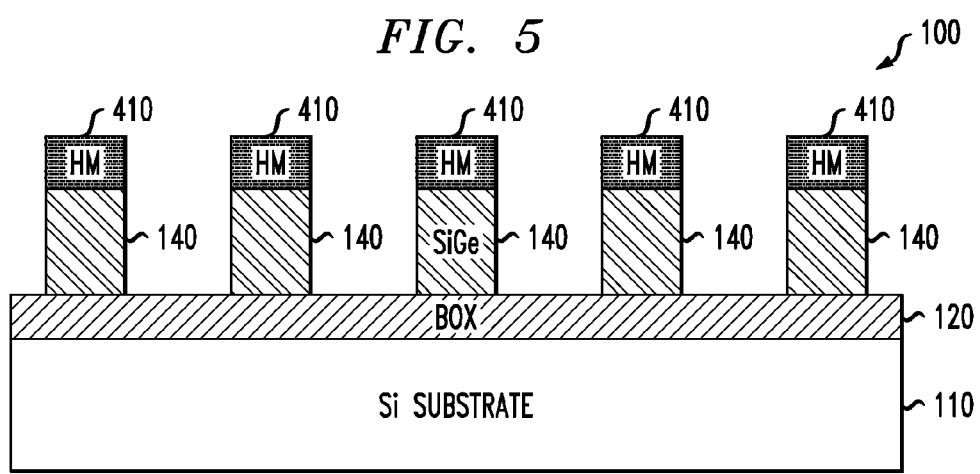
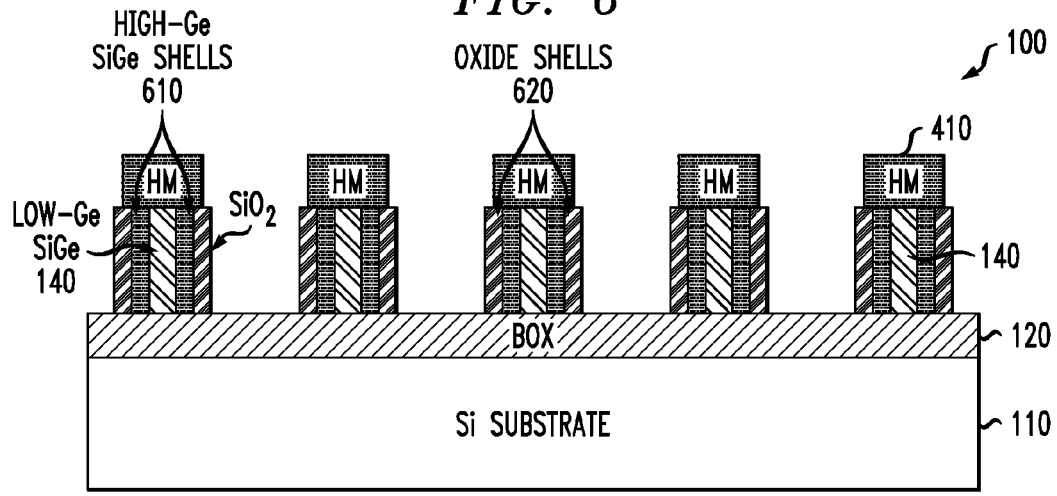

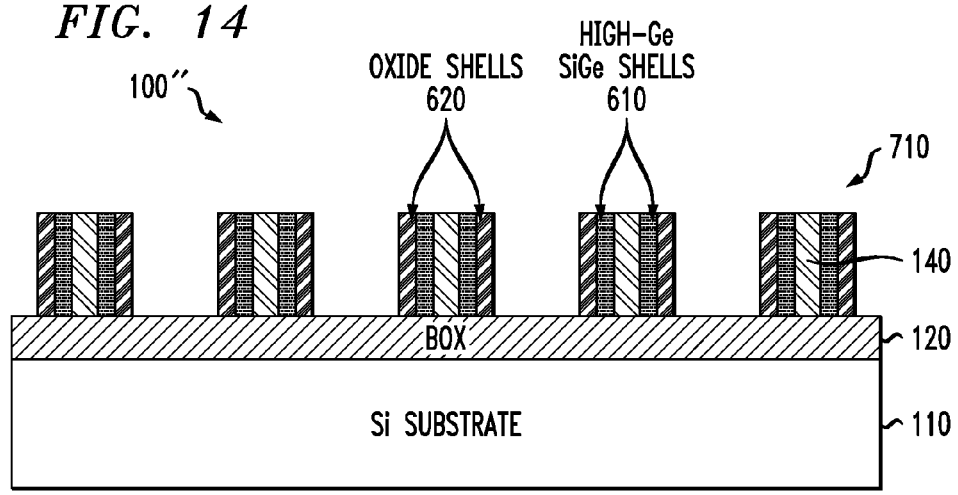
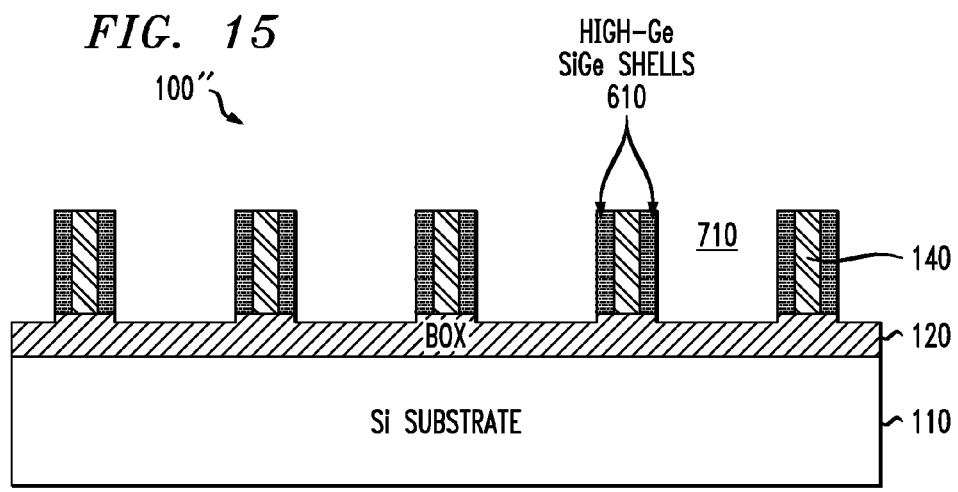
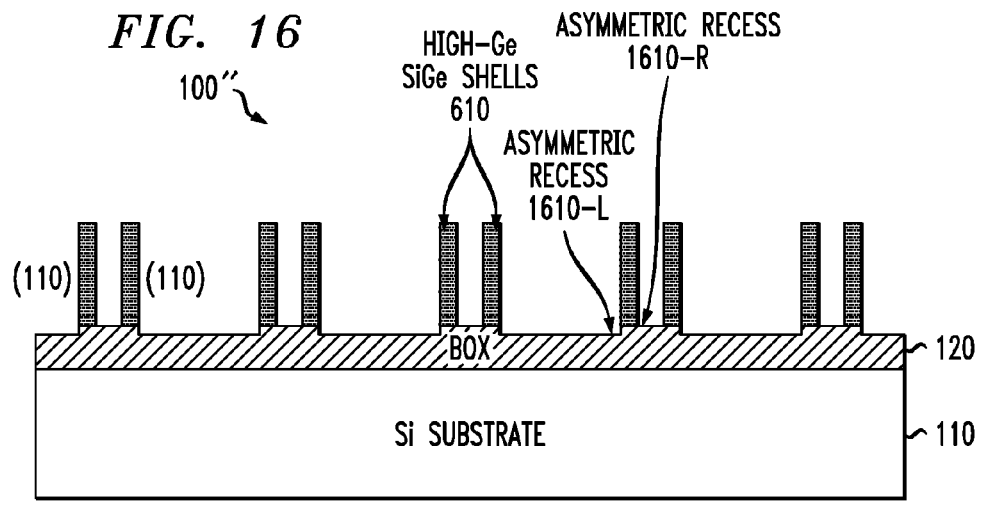

FABRICATION OF FIN STRUCTURES HAVING HIGH GERMANIUM CONTENT

FIELD OF THE INVENTION

The present invention relates generally to semiconductor devices, and, more particularly, to Fin Field Effect Transistors (FinFETs).

BACKGROUND OF THE INVENTION

The downscaling of the physical dimensions of metal oxide semiconductor field effect transistors (MOSFETs) has led to performance improvements of integrated circuits and an increase in the number of transistors per chip. Multiple gate MOSFET structures, such as FinFETs and tri-gate structures, have been proposed as promising candidates for 7 nm technology nodes and beyond. In addition, high-mobility channel materials, such as Germanium (Ge), have been proposed as technology boosters to further improve MOSFET scaling improvements.

For example, a FinFET is a multi-gate structure that includes a conducting channel formed in a vertical fin, such as a Silicon-germanium (SiGe) fin, that forms the gate of the device. Fins are typically formed in FinFETs by patterning the fin structures using direct etching of the layer of material that is to form the fin channel. High Ge content (HGC) SiGe fins are an attractive channel candidate for sub-7 nm CMOS (Complementary metal-oxide-semiconductor) technology due to higher hole and electron mobilities than with standard Si fins.

A number of techniques have been proposed or suggested for achieving high Ge content SiGe fins, such as growth of high Ge SiGe shells on Si or low Ge content SiGe fins followed by removal of the core fin. See, for example, P. Hashemi et al., "High-Mobility High Ge-Content Si1-xGex-OI PMOS FinFETs with Fins Formed Using 3D Germanium Condensation with Ge Fraction up to x~0.7, Scaled EOT~8.5 Å and ~10 nm Fin Width," 2015 Symposium on VLSI Technology Digest of Technical Papers (June 2015). While this approach works on fins along a <100> direction, where all sidewalls are on (100) planes, an epitaxial facet problem is the real issue for those fins made using a standard state-of-the-art CMOS direction, which is <110> where the fin sidewalls are on (110) planes. As a result, removal of the core results in fin instability and an unusual shape, which is unfavorable for mass production.

Thus, a need remains for improved methods for forming high Ge content SiGe fins.

SUMMARY OF THE INVENTION

Generally, high Ge content SiGe fins are provided, as well as improved techniques for forming high Ge content SiGe fins. According to one exemplary embodiment of the invention, one or more fins are formed for a Fin Field Effect Transistor (FinFET) by obtaining one or more low Ge content SiGe fins having a hard mask deposited thereon; forming a high Ge content SiGe fin around the one or more low Ge content SiGe fins by oxidizing one or more sidewalls of the one or more low Ge content SiGe fins to create one or more oxide shells on the one or more sidewalls; removing the one or more oxide shells; and selectively removing the one or more low Ge content SiGe fins to produce a high Ge content SiGe fin device having one or more high Ge content fins. The one or more high Ge content fins have a Ge fraction equal to or greater than approximately 50%.

In one exemplary embodiment the one or more low Ge content SiGe fins further are obtained by forming a SiGe layer on a semiconductor layer on an insulator; forming a silicon dioxide layer on the SiGe layer; selectively removing the silicon dioxide layer from the SiGe layer; depositing and patterning the hard mask on the SiGe layer; and etching the SiGe layer with the hard mask to expose the one or more low Ge content SiGe fins.

According to another exemplary embodiment of the invention, a Fin Field Effect Transistor (FinFET) is provided, comprising an insulating layer; and at least one high Ge content fin formed on the insulating layer, wherein the at least one high Ge content fin has asymmetric recesses into the insulator layer. The asymmetric recesses comprise a first recess on a first side of the at least one high Ge content fin being deeper into the insulator layer than a second recess on a second side of the at least one high Ge content fin.

A more complete understanding of the present invention, as well as further features and advantages of the present invention, will be obtained by reference to the following detailed description and drawings.

BRIEF DESCRIPTION OF THE DRAWINGS

FIGS. 1 through 10 illustrate a high Ge content SiGe fin device through various steps of an exemplary process for forming high Ge content SiGe fin devices in accordance with the present invention;

FIGS. 14-16 illustrate a second exemplary variation of the invention.

DETAILED DESCRIPTION OF PREFERRED EMBODIMENTS

Aspects of the present invention provide improved methods and apparatus for forming high Ge content SiGe fins. In one exemplary embodiment of the invention, high Ge content SiGe fins are formed around low Ge content SiGe fin using a Ge pile up method using oxidation followed by core SiGe fin removal. Among other benefits, in at least one exemplary embodiment, the disclosed techniques for forming high Ge content SiGe fins provide shell SiGe layers having a vertical profile and sub-7 nm high Ge content SiGe fins are achieved on semiconductor on insulator (SOI) substrates or bulk substrates. In addition, dense fins can be achieved with one or more embodiments of the invention.

As used herein, a "high Ge content SiGe fin" refers to those fins having a relatively high Ge fraction equal to or greater than approximately 50% and a "low Ge content SiGe fin" refers to those fins having a relatively low Ge fraction that is less than approximately 30%.

FIGS. 1 through 10 illustrate a high Ge content SiGe fin device 100 through various steps of an exemplary process for forming high Ge content SiGe fin devices in accordance with the present invention. FIGS. 1 through 10 are side views of a portion of the process for forming high Ge content SiGe fin device 100. As noted above, the exemplary techniques for forming high Ge content SiGe fins employ an SOI substrate or a bulk substrate.

Figure 1:
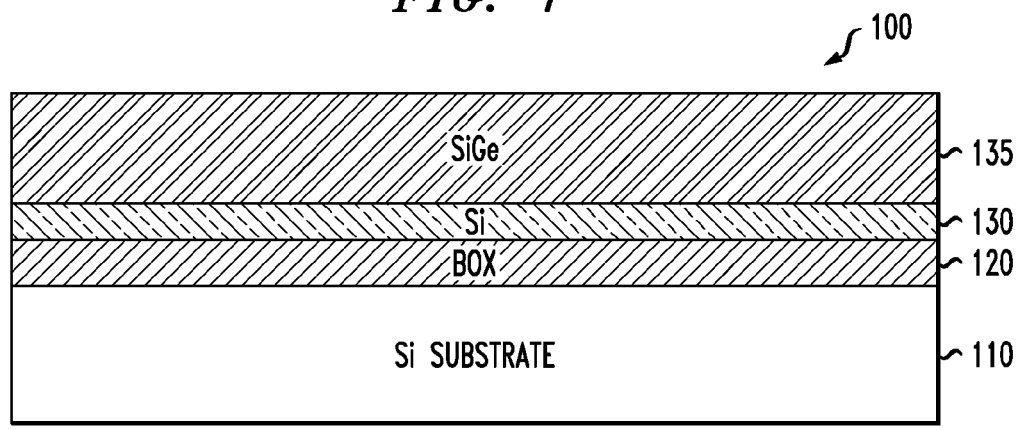

As shown in FIG. 1, a SiGe layer 135 is formed on a semiconductor layer 130, such as silicon, on an insulator layer 120, which may be a buried oxide (BOX) layer, formed in a semiconductor substrate 110. In one exemplary embodiment, the SiGe layer 135 is epitaxially grown on the Si layer 130, where $Si_{1-x}Ge_x$ (0.15<x<0.5).

Figure 2:
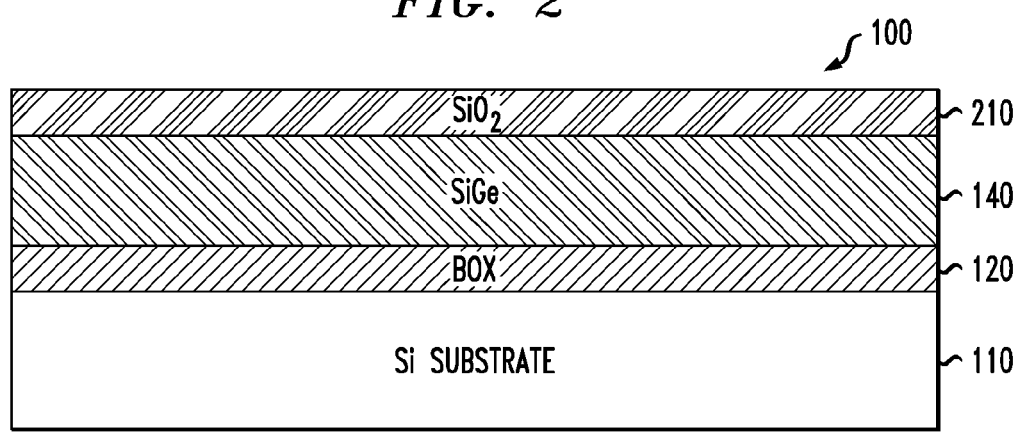

As shown in FIG. 2, a silicon dioxide ($SiO_2$) layer 210 is then formed on a SiGe layer 140 as a result of planar germanium condensation during an oxidation step, for example, using a furnace with diluted oxygen in nitrogen. In one exemplary embodiment, the initial Ge condensation results in a uniform $Si_{1-x}Ge_x$ (0.15<x<0.5) layer 140 using an oxidation process with a temperature in the range of 600-1200° C.

Figure 3:
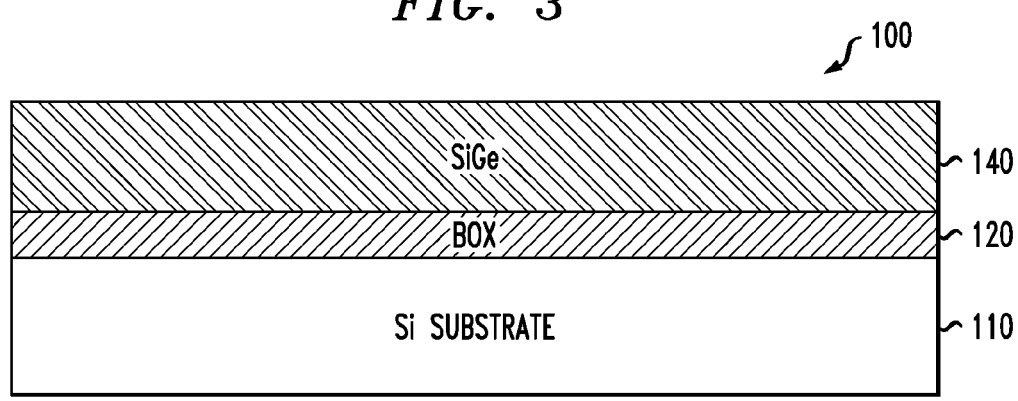

As shown in FIG. 3, the silicon dioxide ($SiO_2$) layer 210 is then selectively removed, for example, using a wet etch process and a selectivity ratio of over approximately 100:1.

As shown in FIG. 4, a hard mask (HM) 410 is then deposited and patterned on the SiGe layer 140, in a known manner. The hard mask 410 may be, for example, a nitride. The hard mask 410 typically has dimensions of approximately 20 nm-40 nm.

As shown in FIG. 5, the SiGe layer 140 of the high Ge content SiGe fin device 100 is then etched using a reactive ion etching (RIE). As shown in FIG. 5, the RIE etch step selectively removes the SiGe layer 140 that is not protected by the hard mask pattern 410. It is noted that the remaining portions of the SiGe layer 140 have a low Ge content.

As shown in FIG. 6, an oxidation process in a furnace or a rapid thermal oxidation process is then performed that applies $SiO_2$ to the sidewall of the high Ge content SiGe fin device 100. The oxidation results in oxide shells 620 and a Ge pile up at the surface of the remaining low Ge portions of the SiGe layer 140. Thus, uniform high Ge content SiGe shells 610 are achieved, surrounding the remaining low Ge portions of the SiGe layer 140. It is noted that the remaining low Ge portions of the SiGe layer 140 shown in FIG. 6 have substantially similar dimensions as the corresponding portions of FIG. 5, but the scale has been changed in FIG. 6 for ease of illustration. As used herein, a "Ge pile up" occurs when a Ge fraction is increased near the $SiO_2$ interface, resulting in a higher Ge content Silicon-Germanium at the $SiO_2$/SiGe interface.

For a more detailed discussion of a suitable oxidation process, see, for example, P. Hashemi et al., "High-Mobility High Ge-Content $Si_{1-x}Gex$-OI PMOS FinFETs with Fins Formed Using 3D Germanium Condensation with Ge Fraction up to x~0.7, Scaled EOT~8.5 Å and ~10 nm Fin Width," 2015 Symposium on VLSI Technology Digest of Technical Papers (June 2015), incorporated by reference herein. It is noted, however, that while the oxidation process employed in the P. Hashemi et al. applies $SiO_2$ to all surfaces of the high Ge content SiGe fin device 100, aspects of the present invention apply $SiO_2$ only to the sidewall of the high Ge content SiGe fin device 100.

In one exemplary embodiment, an 8 nm gap is maintained between the two high Ge content SiGe shells 610 on each side of the high Ge content SiGe fin device 100. In this manner, the two high Ge content SiGe shells 610 will not merge and dense fins can be achieved with one or more embodiments of the invention. For example, in one exemplary implementation, a distance of approximately 14 nm between the centers of two adjacent high Ge content SiGe shells 610 was observed.

Figure 7:
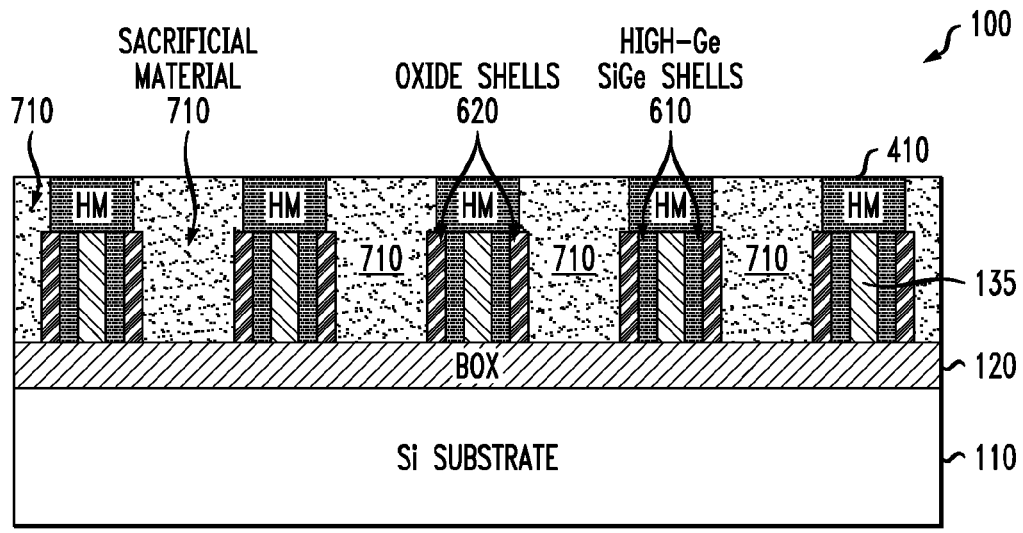

As shown in FIG. 7, a sacrificial material 710, such as an amorphous Si, is then deposited and polished using, for example, a chemical mechanical polishing (CMP) up to the top of the hard masks 410.

Figure 8:
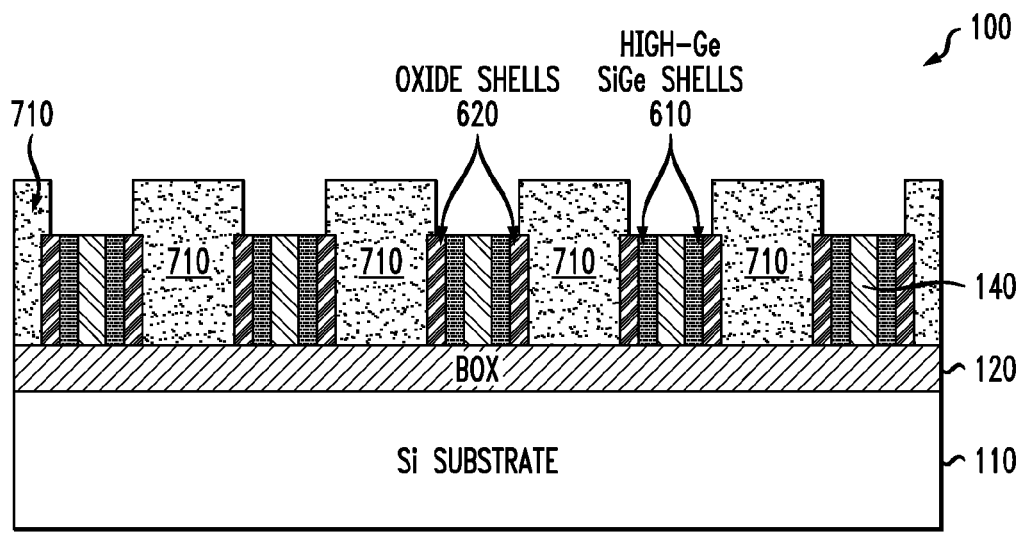

As shown in FIG. 8, the hard mask 410 is then selectively removed, for example, using a hot phosphorous acid ($H_3PO_4$) bath.

Figure 9:
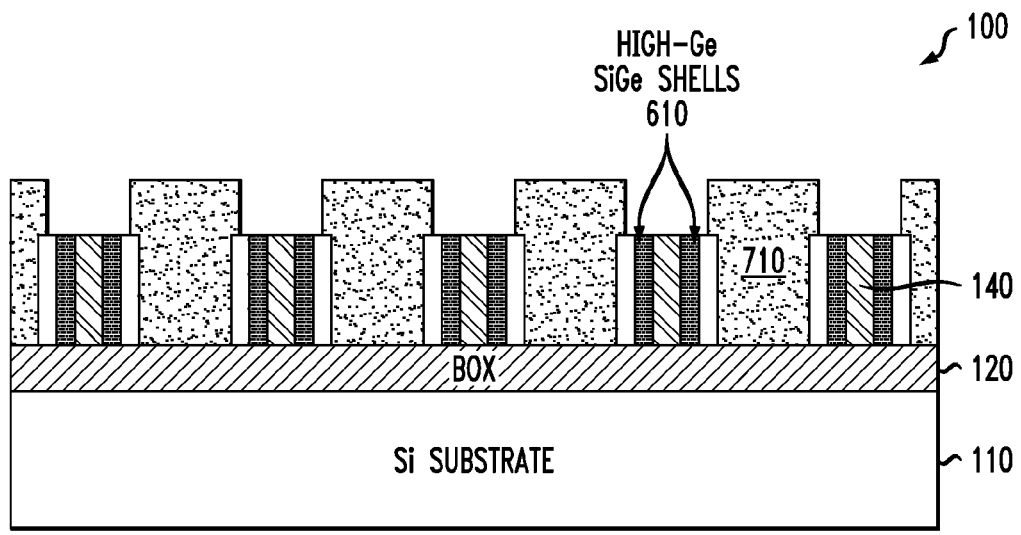

As shown in FIG. 9, the oxide shells 620 that were applied in FIG. 6 are removed, for example, using a Dilute Hydrofluoric Acid (DHF) dip that removes a silicon dioxide layer. DHF can access the top portion of the oxide and a time controlled etch can clear the shell oxide around the fins.

Figure 10:
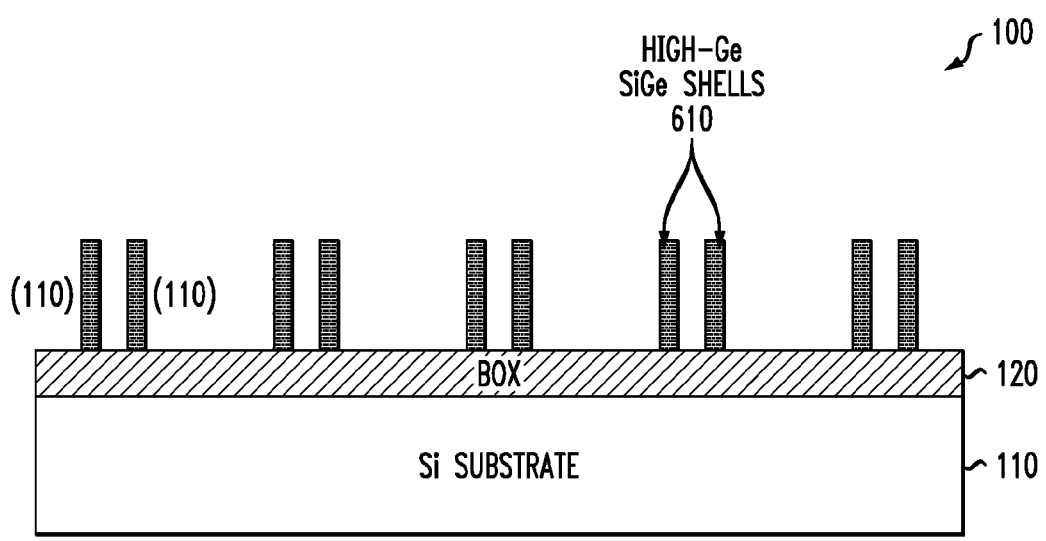

As shown in FIG. 10, the low Ge content SiGe/Si cores 140 and sacrificial material 710 are then selectively removed by either a wet etch or a selective dry etch process, for example, using Tetramethylammonium hydroxide (TMAH). Thereafter, the high Ge content SiGe fin device 100 is complete, with the fins formed by the remaining high Ge content shells 610. The exemplary fins formed by the remaining High-Ge SiGe Shells 610 have (i) high Ge content, (ii) vertical fin sidewalls on (110) planes, and (iii) a fin density of approximately 14 nm between the centers of two adjacent high Ge content SiGe shells 610 (in at least one exemplary embodiment).

Figure 11:
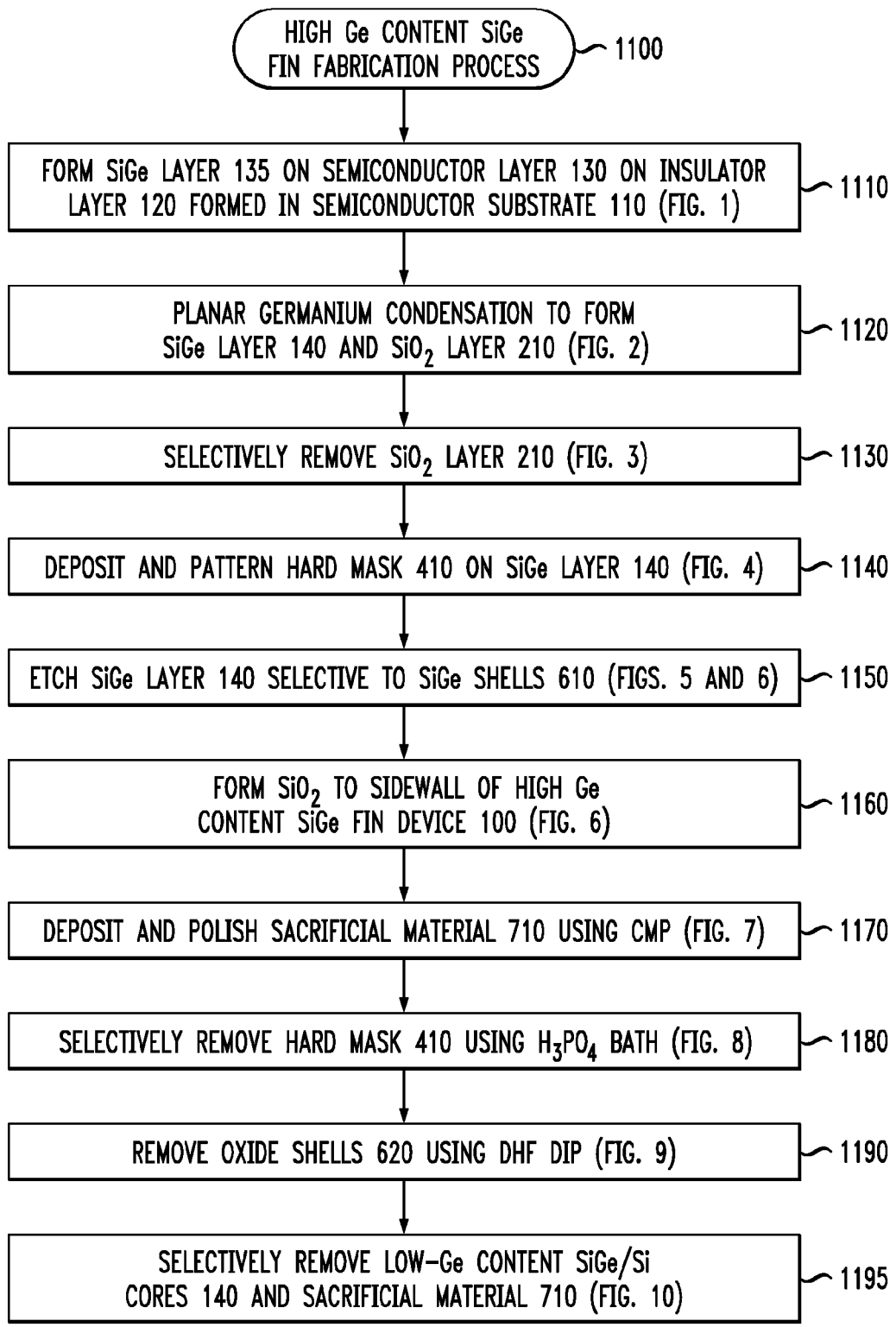
FIG. 11 is a flow chart illustrating an exemplary implementation of an exemplary high Ge content SiGe fin fabrication process according to one embodiment of the invention.

FIG. 11 is a flow chart illustrating an exemplary high Ge content SiGe fin fabrication process 1100 incorporating aspects of the present invention. As shown in FIG. 11, the exemplary high Ge content SiGe fin fabrication process 1100 initially forms a SiGe layer 135 on a semiconductor layer 130 on an insulator layer 120 formed in a semiconductor substrate 110, as discussed above in conjunction with FIG. 1, during step 1110. Thereafter, planar germanium condensation forms SiGe Layer 140 and $SiO_2$ layer 210, as discussed above in conjunction with FIG. 2, during step 1120. The $SiO_2$ layer 210 is then selectively removed, as discussed above in conjunction with FIG. 3, during step 1130.

The exemplary high Ge content SiGe fin fabrication process 1100 then deposits and patterns a hard mask 410 on the SiGe layer 140, as discussed above in conjunction with FIG. 4, during step 1140. The SiGe layer 140 is then etched selective to SiGe Shells 610, as discussed above in conjunction with FIGS. 5 and 6, during step 1150.

The exemplary high Ge content SiGe fin fabrication process 1100 then forms $SiO_2$ to the sidewall of the high Ge content SiGe fin device 100, as discussed above in conjunction with FIG. 6, during step 1160. A sacrificial material 710 is then deposited and polished using CMP, as discussed above in conjunction with FIG. 7, during step 1170.

The exemplary high Ge content SiGe fin fabrication process 1100 then selectively removes the hard mask 410 during step 1180 using a hot phosphorous acid bath, as discussed above in conjunction with FIG. 8. The oxide shells 620 are removed during step 1190 using a DHF dip, as discussed above in conjunction with FIG. 9. Finally, the low Ge content SiGe/Si cores 140 and sacrificial material 710 are selectively removed, as discussed above in conjunction with FIG. 10, during step 1195, to produce the high Ge content SiGe fin device 100 having fins formed by the remaining high Ge content shells 610.

Variations

Figure 12:
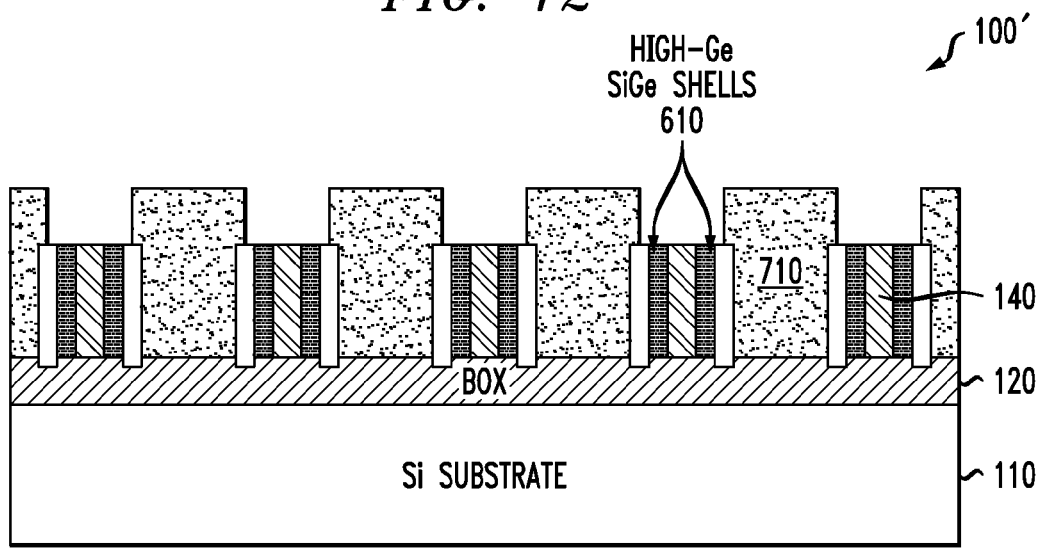
FIGS. 12 and 13 illustrate a first exemplary variation of the invention.
Figure 13:
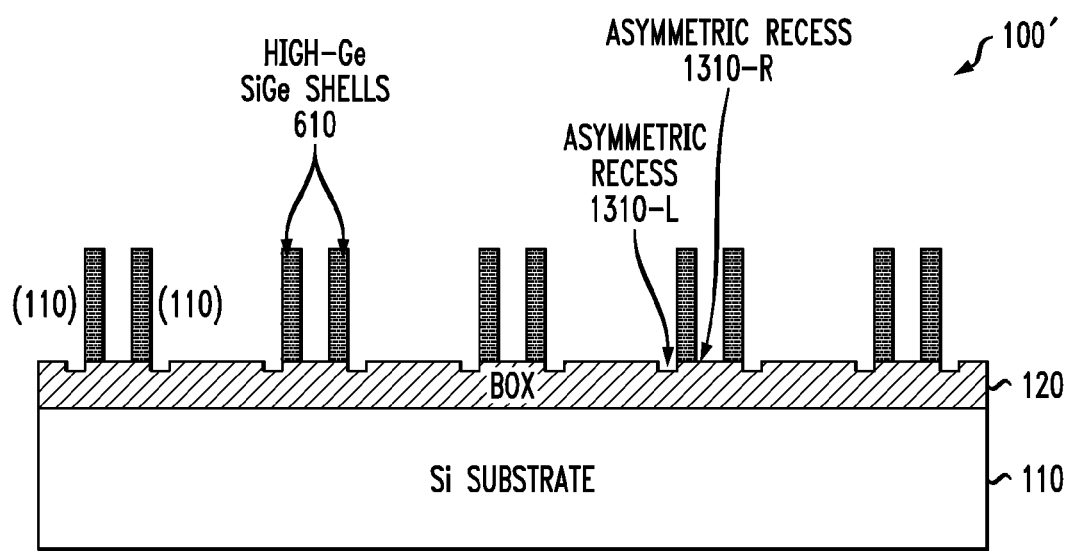

FIGS. 12 and 13 illustrate a first exemplary variation of the invention. The fabrication process for the first exemplary variation initially continues in the same manner as discussed above in conjunction with FIGS. 1-8, up to the step where the hard mask 410 is selectively removed, for example, using a hot phosphorous acid ($H_3PO_4$) bath.

In the processing step of FIG. 12, the oxide shells 620 that were applied in FIG. 6 are removed, for example, using a DHF dip that removes a silicon dioxide layer deeper, relative to the processing of FIG. 9, into the insulator layer 120. As noted above, DHF can access the top portion of the oxide and a time controlled etch can clear the shell oxide around the fins.

As shown in FIG. 13, the low Ge content SiGe/Si cores 140 and sacrificial material 710 are then selectively removed by either a wet etch or a selective dry etch process, in a similar manner as FIG. 10, for example, using TMAH. Thereafter, the high Ge content SiGe fin device 100' of the first exemplary variation is complete, with the fins formed by the remaining high Ge content shells 610. The exemplary fins formed by the remaining High-Ge SiGe Shells 610 have (i) high Ge content, (ii) vertical fin sidewalls on (110) planes, (iii) a fin density of approximately 14 nm between the centers of two adjacent high Ge content SiGe shells 610 (in at least one exemplary embodiment), and (iv) asymmetric recesses into the insulator layer 120, such as 1310-L and 1310-R on the left and right side of each fin.

FIGS. 14-16 illustrate a second exemplary variation of the invention. The fabrication process for the second exemplary variation initially continues in the same manner as discussed above in conjunction with FIGS. 1-6, up to the oxidation process. In the processing step of FIG. 14, the hard mask 410 is then selectively removed, for example, using a hot phosphorous acid ($H_3PO_4$) bath, in the manner discussed above in conjunction with FIG. 8. It is noted that a sacrificial material is not employed in the second exemplary variation.

As shown in FIG. 15, the oxide shells 620 that were applied in FIG. 6 are removed, for example, using a DHF dip that removes a silicon dioxide layer deeper, relative to the processing of FIG. 9, into the insulator layer 120, in a similar manner as FIG. 12. As noted above, DHF can access the top portion of the oxide and a time controlled etch can clear the shell oxide around the fins.

As shown in FIG. 16, the low Ge content SiGe/Si cores 140 are then selectively removed by either a wet etch or a selective dry etch process, in a similar manner as FIG. 10, for example, using TMAH. Thereafter, the high Ge content SiGe fin device 100" of the second exemplary variation is complete, with the fins formed by the remaining high Ge content shells 610. The exemplary fins formed by the remaining High-Ge SiGe Shells 610 have (i) high Ge content, (ii) vertical fin sidewalls on (110) planes, (iii) a fin density of approximately 14 nm between the centers of two adjacent high Ge content SiGe shells 610 (in at least one exemplary embodiment), and (iv) asymmetric recesses into the insulator layer 120, such as 1610-L and 1610-R on the left and right side of each fin.

CONCLUSION

The foregoing description discloses only exemplary embodiments of the invention. Modifications of the above disclosed structures and method which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming one or more fins for a Fin Field Effect Transistor (FinFET), comprising:
    obtaining one or more low Ge content SiGe fins having a hard mask deposited thereon;
    forming a high Ge content SiGe fin around the one or more low Ge content SiGe fins by oxidizing one or more sidewalls of the one or more low Ge content SiGe fins to create one or more oxide shells on the one or more sidewalls;
    removing the one or more oxide shells; and
    selectively removing the one or more low Ge content SiGe fins to produce a high Ge content SiGe fin device having one or more high Ge content fins.

2. The method of claim 1, wherein the step of removing the one or more oxide shells uses a Dilute Hydrofluoric Acid (DHF) dip.

3. The method of claim 1, wherein the step of selectively removing the one or more low Ge content SiGe fins uses one or more of a wet etch process and a selective dry etch process.

4. The method of claim 1, wherein the step of obtaining one or more low Ge content SiGe fins further comprises:
    forming a SiGe layer on a semiconductor layer on an insulator;
    forming a silicon dioxide layer on the SiGe layer;
    selectively removing the silicon dioxide layer from the SiGe layer;
    depositing and patterning the hard mask on the SiGe layer; and
    etching the SiGe layer with the hard mask to expose the one or more low Ge content SiGe fins.

5. The method of claim 4, wherein said silicon dioxide layer is formed on the SiGe layer a result of condensation.

6. The method of claim 4, further comprising the step of selectively removing the hard mask using a hot phosphorous acid bath.

7. The method of claim 1, wherein said one or more high Ge content fins have a Ge fraction equal to or greater than approximately 50%.

8. The method of claim 1, further comprising the steps of:
depositing a sacrificial material between the one or more oxidized sidewalls; and
selectively removing the sacrificial material with the one or more low Ge content SiGe fins to produce the high Ge content SiGe fin device having one or more high Ge content fins.

9. The method of claim 8, wherein the step of depositing said sacrificial material further comprises a chemical mechanical polishing (CMP).

10. The method of claim 1, wherein the step of removing the one or more oxide shells removes a silicon dioxide layer on a SiGe layer into an insulator layer below a length of said one or more high Ge content fins.

11. The method of claim 10, further comprising the step of selectively removing a sacrificial material deposited between the one or more oxidized sidewalls.

12. The method of claim 1, further comprising the step of selectively removing the hard mask.

13. The method of claim 12, wherein the step of removing the one or more oxide shells removes a silicon dioxide layer on a SiGe layer into an insulator layer below a length of said one or more high Ge content fins.

14. The method of claim 1, wherein said one or more high Ge content fins are incorporated in an integrated circuit.

15. A Fin Field Effect Transistor (FinFET), comprising:
an insulating layer; and
at least one high Ge content fin formed on said insulating layer, wherein said at least one high Ge content fin has asymmetric recesses into the insulator layer, wherein said asymmetric recesses comprise a first recess on a first side of said at least one high Ge content fin being deeper into the insulator layer than a second recess on a second side of said at least one high Ge content fin into the insulating layer.

16. The FinFET of claim 15, wherein said one or more high Ge content fins have a Ge fraction equal to or greater than approximately 50%.

17. An integrated circuit, comprising:
an insulating layer; and
at least one high Ge content fin formed on said insulating layer, wherein said at least one high Ge content fin has asymmetric recesses into the insulator layer, wherein said asymmetric recesses comprise a first recess on a first side of said at least one high Ge content fin being deeper into the insulator layer than a second recess on a second side of said at least one high Ge content fin into the insulating layer.

18. The integrated circuit of claim 17, wherein said one or more high Ge content fins have a Ge fraction equal to or greater than approximately 50%.

* * * * *